(12) United States Patent
Tan et al.

(10) Patent No.: US 9,255,979 B2
(45) Date of Patent: Feb. 9, 2016

(54) MEASURING DIFFUSIONAL ANISOTROPY OF ODF LOBES HAVING MAXIMA PEAKS AND MINIMA TROUGHS WITH DIFFUSION WEIGHTED MRI

(75) Inventors: Ek Tsoon Tan, Mechanicville, NY (US); Christopher Judson Hardy, Schenectady, NY (US); Luca Marinelli, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 972 days.

(21) Appl. No.: 13/444,685

(22) Filed: Apr. 11, 2012

(65) Prior Publication Data

US 2013/0271130 A1 Oct. 17, 2013

(51) Int. Cl.
*G01R 33/563* (2006.01)

(52) U.S. Cl.
CPC ................................ *G01R 33/56341* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 5,539,310 A | 7/1996 | Basser et al. | |
| 6,845,342 B1 | 1/2005 | Basser et al. | |
| 6,992,484 B2 | 1/2006 | Frank | |
| 7,034,531 B1* | 4/2006 | Tuch et al. | 324/309 |
| 7,643,863 B2 | 1/2010 | Basser et al. | |
| 8,169,216 B2* | 5/2012 | Yanasak | 324/307 |
| 8,330,462 B2* | 12/2012 | Poupon | G01R 33/56341 324/300 |
| 8,593,142 B2* | 11/2013 | Mori | G01R 33/56341 324/309 |
| 2009/0037108 A1 | 2/2009 | Wedeen | |
| 2009/0267603 A1* | 10/2009 | Yanasak | 324/309 |
| 2010/0135560 A1* | 6/2010 | Embleton | G01R 33/56341 382/131 |
| 2010/0244834 A1* | 9/2010 | Mori | G01R 33/56341 324/310 |
| 2010/0308821 A1* | 12/2010 | Poupon | G01R 33/56341 324/309 |
| 2011/0282183 A1* | 11/2011 | Song | G01R 33/56341 600/410 |
| 2013/0271130 A1* | 10/2013 | Tan et al. | 324/309 |
| 2014/0294270 A1* | 10/2014 | Schneider | A61B 5/055 382/131 |

FOREIGN PATENT DOCUMENTS

WO 2007036859 A2 4/2007

OTHER PUBLICATIONS

Descoteaux, Maxine, et al.; "A linear and regularized ODF estimation algorithm to recover multiple fibers in Q-Ball imaging," Rapport de recherche, Nov. 2005, 45 pages.

Deriche, R, et al.; "Splitting tracking through crossing fibers; Multidirectional Q-Ball tracking," 4th IEEE International Symposium on Biomedical Imaging: from Nano to Marco—Proceedings, 2007, pp. 756-759.

(Continued)

*Primary Examiner* — Melissa Koval
*Assistant Examiner* — Tiffany Fetzner
(74) *Attorney, Agent, or Firm* — Melissa K. Dobson

(57) ABSTRACT

A method for measuring diffusional anisotropy in diffusion-weighted magnetic resonance imaging. The method includes determining an orientation diffusion function (ODF) for one or more fibers within a single voxel, wherein the ODF includes lobes representative of a probability of diffusion in a given direction for the one or more fibers. The method also includes characterizing an aspect ratio of the lobes. The method further includes determining a multi-directional anisotropy metric for the one or more fibers based on the aspect ratio of the lobes.

15 Claims, 4 Drawing Sheets

(56) References Cited

OTHER PUBLICATIONS

Jian, Bing, et al.; "A unified computational framework for deconvolution to reconstruct multiple fibers from diffusion weighted MRI," IEEE Transactional on Medical Imaging, vol. 26, No. 11, Nov. 2007, pp. 1465-1471.

Descoteaux, Maxine, et al.; "Deterministic and probabilistic Q-Ball Tractography: from diffusion to sharp fiber distribution," Rapport de recherche, Aug. 2007, 36 pages.

Schultz, Thomas; "Feature extraction for DW-MRI visualization: the state of the art and beyond," Dagauhl Scientific Visualization Workshop 2009, 24 pages.

Schultz, Thomas, et al.: "Crease surfaces: from theory to extraction and application to diffusion tensor MRI," IEEE Transactions on Visualization and Computer Sciences, vol. 16, No. 1, Jan./Feb. 2010, pp. 109-119.

Ghosh, Aurobrata, et al.; "Extracting geometrical features & peak fractional anisotropy from the ODF for white matter characterization," IEEE International Symposium on Biomedical Imaging: from Nano to Marco, Version 1, Nov. 28, 2011, 6 pages.

Ulug, Aziz M., et al.; "Orientation-Independent diffusion imaging without tensor diagonalization: anisotropy definitions based on physical attributes of the diffusion ellipsoid," Journal of Magnetic Resonance Imaging 9:804-813, 1999.

Rottger, Diana, et al.; "Distance-based tractography in high angular resolution diffusion MRI," Vis Comput (2011) 27:729-738.

Tuch, David S.; "Q-Ball imaging," Magnetic Resonance in Medicine 52:1358-1372 (2004).

Pierpaoli, Carlo, et al,; "Toward a quantitative assessment of diffusion anisotropy," Magnetic Resonance in Medicine, 1996, pp. 893-906.

Ghosh, Aurobrata, et al.; "A polynomial approach for maxima extraction and its application to tractography in HARDI," International Conference on Information Processing in Medical Imaging, Jul. 7, 2011, 33 pages.

\* cited by examiner

MEASURING DIFFUSIONAL ANISOTROPY OF ODF LOBES HAVING MAXIMA PEAKS AND MINIMA TROUGHS WITH DIFFUSION WEIGHTED MRI

BACKGROUND

Diffusion-weighted magnetic resonance imaging (MRI) techniques are known in the field of medical diagnosis and medical diagnostic imaging. In diffusion-weighted MRI, the degree of anisotropic diffusion can be indicative of pathology or disease. Thus, an accurate metric for diffusional anisotropy can be an important biomarker for diseases such as multiple sclerosis and traumatic brain injury. However, in the brain, neuronal fibers of multiple directionalities may be present within any given voxel, complicating the measurement of anisotropic diffusion.

BRIEF DESCRIPTION

In a first embodiment, a method is shown for measuring diffusional anisotropy in diffusion-weighted magnetic resonance imaging. The method includes determining an orientation diffusion function (ODF) for one or more fibers within a single voxel, wherein the ODF includes lobes representative of a probability of diffusion in a given direction for the one or more fibers. The method also includes characterizing an aspect ratio of the lobes. The method further includes determining a multi-directional anisotropy metric for the one or more fibers based on the aspect ratio of the lobes.

In a second embodiment, a non-transitory, computer-readable medium that includes one or more routines, which when executed by at least one processor, causes acts to be performed is provided. The acts include determining an orientation diffusion function (ODF) for one or more fibers within a single voxel, wherein the ODF includes lobes representative of a probability of diffusion in a given direction for the one or more fibers. The method also includes characterizing an aspect ratio of the lobes. The method further includes determining a multi-directional anisotropy metric for the one or more fibers based on the aspect ratio of the lobes.

In a third embodiment, a method for measuring diffusional anisotropy in diffusion-weighted magnetic resonance imaging is provided. The method includes determining an orientation diffusion function (ODF) for multiple fibers within a single voxel, wherein at least some of the multiple fibers cross one another within the single voxel. The method also includes determining a multi-directional anisotropy metric for the multiple fibers directly based on one or more characteristics of the ODF.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The embodiments described herein may be performed by a suitable magnetic resonance imaging (MRI) system, wherein specific imaging routines (e.g., diffusion-weighted imaging) are initiated by a user (e.g., a radiologist). As discussed herein, one use made of diffusion-weighted MRI data is to measure diffusional anisotropy for fibers (e.g., neuronal fibers) within one or more voxels, wherein multiple fibers within a given voxel may include multiple directionalities and, thus, some of the fibers cross each other.

Figure 1:
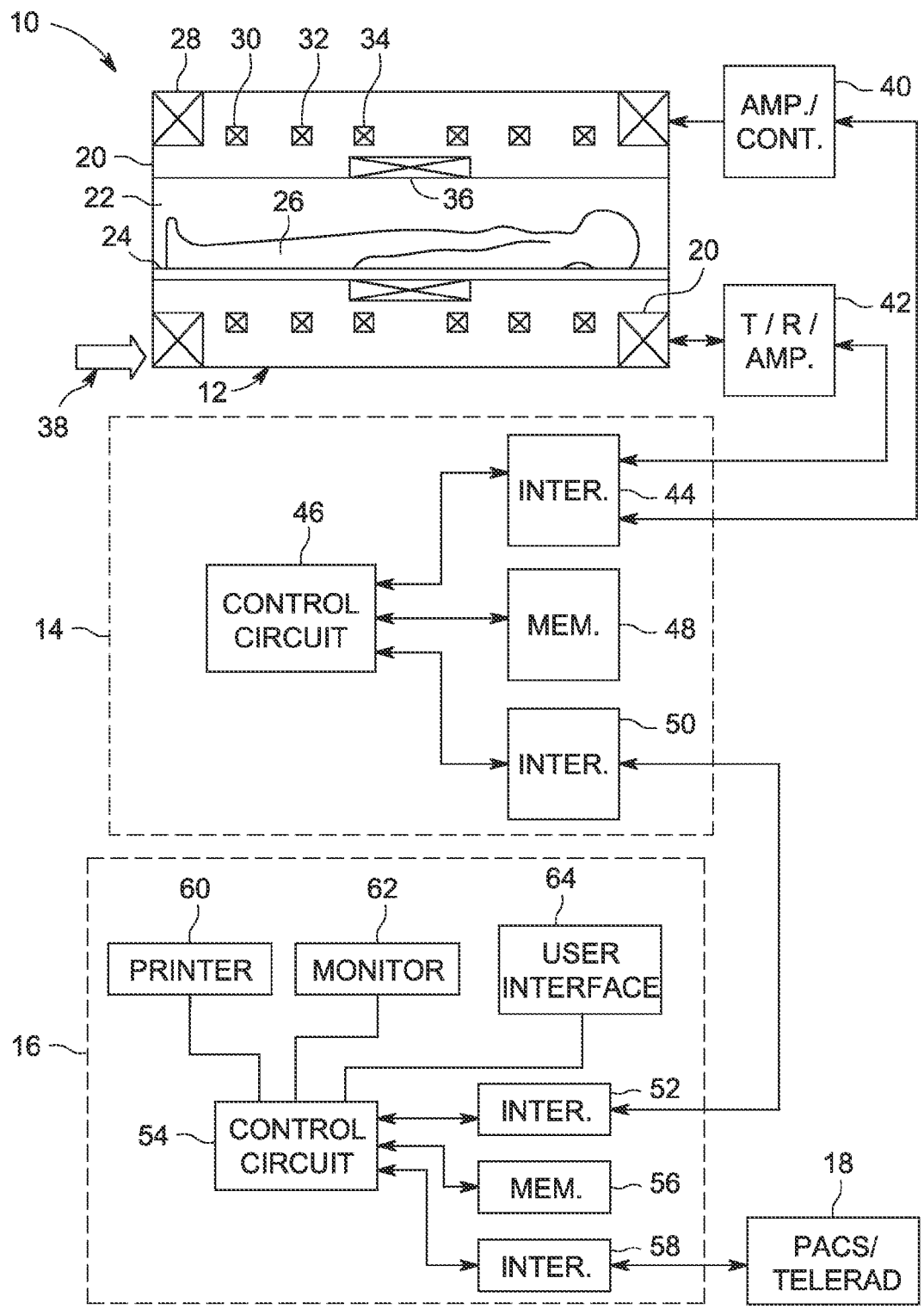
FIG. 1 is a diagrammatic illustration of an embodiment of a magnetic resonance imaging system configured to perform the data acquisition and data processing described herein.

With this in mind, and referring to FIG. 1, a magnetic resonance imaging (MRI) system 10 is illustrated schematically as including a scanner 12, a scanner control circuit 14, and a system control circuitry 16. In the depicted embodiment, the MRI system 10 is generally configured to perform MR imaging, such as diffusion-weighted imaging. System 10 additionally includes or communicates with remote access and storage systems or devices, such as picture archiving and communication systems (PACS) 18, or other devices such as teleradiology equipment so that data acquired by the system 10 may be accessed on- or off-site. In this way, acquired data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing a controlled magnetic field and for detecting emissions from one or more gyromagnetic material within the anatomy of the subject being imaged. A primary magnet coil 28 is provided for generating a primary magnetic field generally aligned with the bore 22. In scanners 12 where acquired signals are spatially resolved, a series of gradient coils 30, 32, and 34 are present which permit controlled magnetic gradient fields to be generated during examination sequences. A radio frequency (RF) coil 36 is provided for generating radio frequency pulses for exciting the gyromagnetic material, such as for spin perturbation or slice selection. A separate receiving coil or the same RF coil 36 may receive magnetic resonance signals from the gyromagnetic material during examination sequences.

The various coils of scanner 12 are controlled by external circuitry to generate the desired field and pulses, and to read emissions from the gyromagnetic material in a controlled manner. In the illustrated embodiment, a main power supply 38 is provided for powering the primary field coil 28. Driver circuit 40 is provided for pulsing the gradient field coils 30, 32, and 34, if such gradient coils are present. Such a driver circuit 40 typically includes amplification and control circuitry for supplying current to the coils, such as in accordance with a digitized pulse sequence output by the scanner control circuit 14. Another control circuit 42 is provided for regulating operation of the RF coil 36. Control circuit 42 will typically include a switching device for alternating between the active and passive modes of operation, wherein the RF coils transmits and receives signals, respectively. Control circuit 42 also includes amplification circuitry for generating the RF pulses and for processing received magnetic resonance signals.

Scanner control circuit 14 includes an interface circuit 44 which outputs signals for driving the gradient field coils 30, 32, 34 and the RF coil 36 and for receiving the data representative of the magnetic resonance signals produced in examination sequences. The interface circuit 44 is coupled to a control circuit 46. The control circuit 46 executes the commands for driving the circuit 42 and circuit 40 based on defined protocols selected via system control circuit 16. Control circuit 46 also serves to receive the magnetic resonance signals and performs subsequent processing before transmitting the data to system control circuit 16. Scanner control circuit 14 also includes one or more memory structures or circuits 48 which store configuration parameters, pulse sequence descriptions, examination results, and so forth, during operation. Interface circuit 50 is coupled to the control circuit 46 for exchanging data between scanner control circuit 14 and system control circuit 16. Such data will typically include selection of specific examination sequences to be performed, configuration parameters of these sequences, and acquired data (e.g., undersampled data) which may be transmitted in raw or processed form from scanner control circuit 14 for subsequent processing, storage, transmission and display.

System control circuit 16 includes an interface circuit 52 which receives data from the scanner control circuit 14 and transmits data and commands back to the scanner control circuit 14. The interface circuit 52 is coupled to a control circuit 54 which may include a CPU in a multi-purpose or application specific computer or workstation. Control circuit 54 is coupled to a memory structure or circuit 56 to store programming code for operation of the MRI system 10 and to store the processed image data for later reconstruction, display and transmission. For example, the programming code may execute one or more algorithms capable of measuring diffusional anisotropy (e.g., multi-directional anisotropy measurement) for multiple fibers with multiple directionalities within a given voxel that may cross, as discussed herein. An additional interface circuit 58 may be provided for exchanging image data, configuration parameters, and so forth with external system components such as remote access and storage devices 18. Finally, the system control circuit 54 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control circuit 46 associated therewith produce magnetic fields and radio frequency pulses in a controlled manner to excite and encode specific gyromagnetic materials within the patient 26. The scanner 12 and control circuit 46 also sense the signals emanating from such material and create an image of the material being scanned. It should be noted that the MRI system 10 described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Specifically, aspects of the present disclosure include methods for measuring diffusional anisotropy (e.g., multi-directional anisotropy measurement) for multiple fibers with multiple directionalities that may cross within a given voxel, as discussed herein. At least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the data acquisitions described herein, the system 10 may simply store the acquired data for later access locally and/or remotely, for example in a memory circuit (e.g., memory 56). Thus, when accessed locally and/or remotely, the acquired data may be manipulated by one or more processors contained within an application-specific or general purpose computer. The one or more processors may access the acquired data and execute routines suitable for processing or analyzing the data, as described herein.

With the foregoing discussion of a suitable system 10 in mind, the use of diffusion weighted MRI data to measure diffusional anisotropy is discussed below. In three-dimensional space, the probability of diffusion in a given diffusion time $\Delta$ is described by a diffusion-propagator $P(\vec{r}, \Delta)$, denoted here as a function of the radial dimension, $\vec{r}$. A simple model for single-fiber diffusion is a Gaussian model, whereby a principal direction for diffusion $\hat{u}_1$ is identified that has a diffusion coefficient $D_1$, with two orthogonal, transverse directions $\hat{u}_2$ and $\hat{u}_3$ having diffusion coefficients $D_2$ and $D_3$. This assumes $D_1 \geq D_2 \geq D_3$. Diffusion of molecules occurs within an experimentally-controlled time, $\Delta$. Under these assumptions, the diffusion-propagator can be expressed as $$P(\vec{r}, \Delta) = \frac{1}{\sqrt{(4\pi\Delta)^3 D_1 D_2 D_3}} \exp\left(-\frac{x\hat{u}_1 \cdot \hat{u}_1^T x}{4D_1\Delta} - \frac{y\hat{u}_2 \cdot \hat{u}_2^T y}{4D_2\Delta} - \frac{z\hat{u}_3 \cdot \hat{u}_3^T x}{4D_3\Delta}\right), \quad (1)$$

where $$\begin{bmatrix} \hat{u}_1 \\ \hat{u}_2 \\ \hat{u}_3 \end{bmatrix}$$

forms an orthonormal basis in 3-D, and x, y, and z are the Cartesian components of the radius vector $\vec{r}$.

In standard diffusion tensor imaging (DTI) based on the just described single-compartment Gaussian model, a commonly-used metric known as fractional anisotropy (FA) is defined as follows:

$$FA_{DTI} = \sqrt{\frac{3}{2}} \sqrt{\frac{\sum_{i=1}^{3}(D_i - \overline{D})^2}{\sum_{i=1}^{3} D_i^2}}. \quad (2)$$

The orientation distribution function (ODF), denoted $\Psi$, is defined as the weighted average of the diffusion-propagator in the radial dimension along a given direction unit vector $\hat{u}$:

$$\Psi(\hat{u}) = \int P(r) r^2 \, \hat{u} \, dr. \quad (3)$$

In the single-compartment Gaussian model, the ODF achieves its maximum value along the principal direction $\hat{u}_1$. Also, the ODF is minimized in the transverse plane spanned by the unit vectors $\hat{u}_2$ and $\hat{u}_3$. If a further assumption is made that D2=D3, the expressions for the extrema values (e.g., minima and maxima) of the ODF can be computed analytically:

$$\Psi_{max} = \Psi(\hat{u} = \hat{u}_{max}) = \frac{D_1}{4\pi D_2} \quad (4)$$

and $$\Psi_{min} = \Psi(\hat{u} = \hat{u}_{min}) = \frac{D_2}{4\pi D_1}. \quad (5)$$

By substitution of D1 and D2 from equations 4 and 5 into equation 2, the expression for FA that uses the extrema of ODF, which is now called a multi-directional anisotropy (MDA) metric, is $$MDA = \frac{1-\mu}{\sqrt{1+2\mu^2}}, \quad (6)$$

where $$\mu = \left(\frac{\Psi_{min}}{\Psi_{max}}\right)^{2/3}.$$

Figure 2:
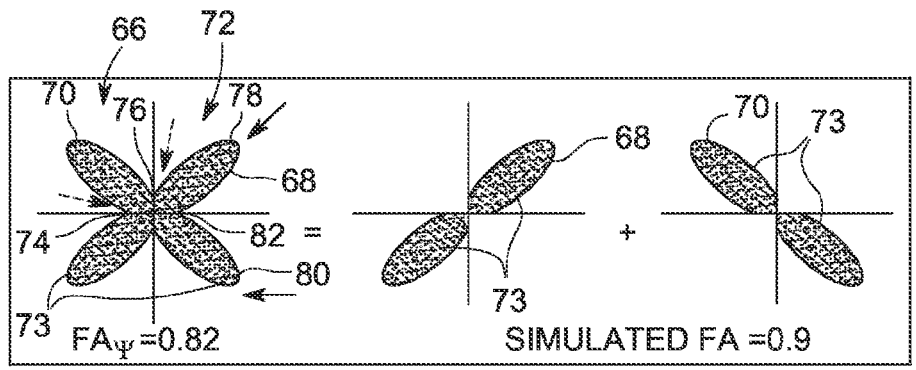
FIG. 2 is an illustration of an embodiment of a simulation of a three-dimensional orientation distribution function (ODF) for two co-planar orthogonal fibers within a voxel.

FIG. 2 illustrates a simulation of a three-dimensional ODF 66 for two co-planar orthogonal fibers 68, 70 within a given voxel 72. The ODF 66 of the fibers 68, 70 includes lobes 73 representative of a probability of diffusion in a given direction for the fibers 68, 70. Peaks or maxima 78, 80 (indicated by solid arrows) of the ODF 66 represent a high probability of diffusion in that particular direction. Troughs or minima 74, 76 (indicated by dashed arrows) of the ODF 66 represent a low probability of diffusion in that particular direction. When the multiple fibers 68, 70 cross in the given voxel 72 as depicted in FIG. 2, the ODF 66 includes several maxima 78, 80 and minima 74, 76 that are not orthogonal to each other. Hence, the assumptions of the single-compartment Gaussian model are no longer satisfied. As depicted, the individual fibers 68, 70 in the multi-fiber voxel 72 can be highly anisotropic, and the overall ODF 66 displays distinct maxima 78, 80 and minima 74, 76 reflecting the geometry of a fiber crossing 82. The MDA metric is able to capture the features of anisotropic diffusion in multi-fiber image voxels. In particular, the MDA metric is able to directly use the characteristics (e.g., geometric characteristics) of the ODF 66. For example, the MDA may use the aspect ratio of the lobes 73 (e.g., extrema values) to directly determine anisotropic diffusion in multiple directionalities for multiple fibers, including fibers that cross, in a given voxel. In certain embodiments, the MDA metric reflects a ratio between the minima and maxima of the ODF 66 and also accounts for multiple peaks and troughs. In contrast, a single-compartment Gaussian model using DTI applied to a voxel with multiple fibers crossing may have anisotropy properties measured by $FA_{DTI}$ that do not reflect the anisotropy of the constituent fibers. On the other hand, the MDA is analytically equivalent to FA for a single fiber in a given voxel (assuming a single diffusion tensor and equal perpendicular diffusivities). Thus, the MDA may be used to determine anisotropic diffusion for one or more fibers in a given voxel, regardless of whether the fibers cross.

Figure 3:
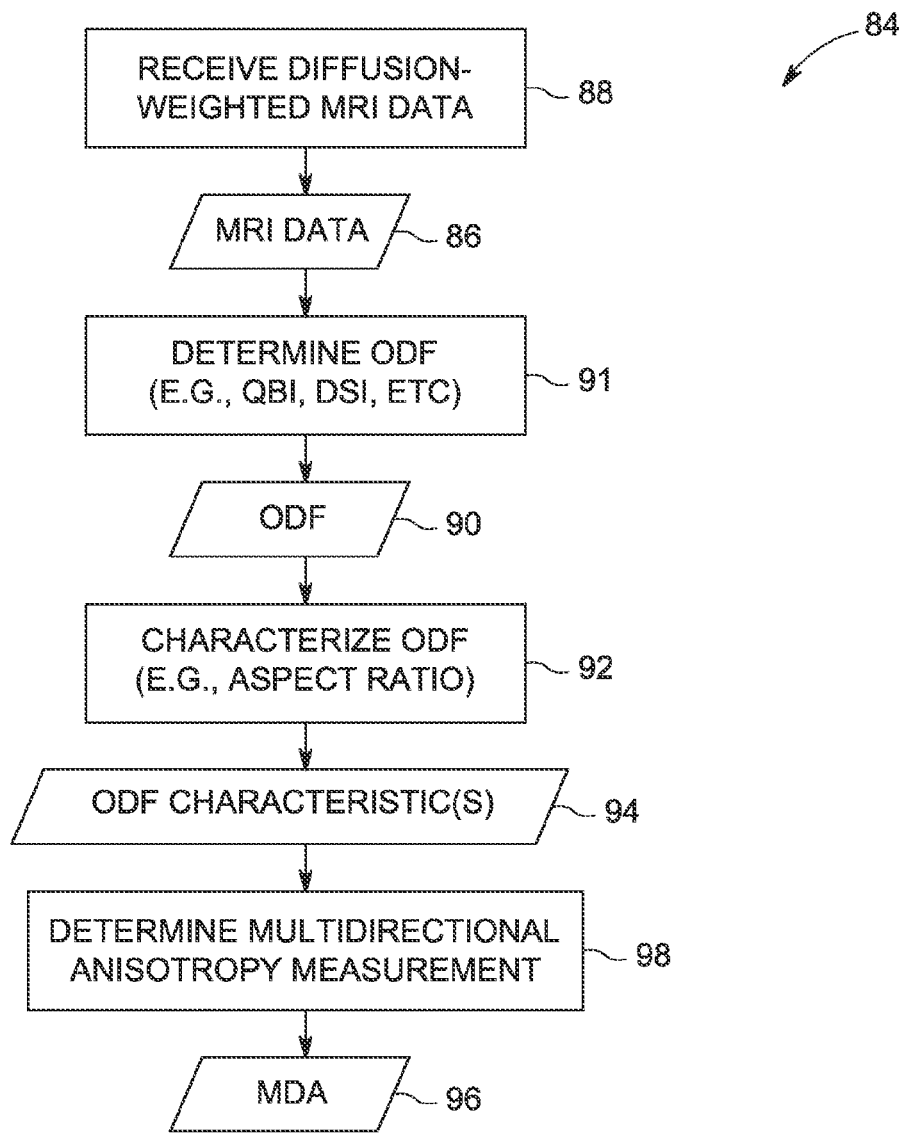
FIG. 3 is an embodiment of a method for measuring diffusional anisotropy in diffusion-weighted magnetic resonance imaging using characteristics of an ODF for fibers within a voxel.

FIG. 3 illustrates an embodiment of a method 84 for measuring diffusional anisotropy in diffusion-weighted MRI. The method 84 includes receiving diffusion weighted MRI data 86 having multiple voxels (block 88). After receiving the MRI data 86 (block 88), the method 84 includes determining the ODF 90 for one or more fibers within a single voxel for one or more voxels (block 91). In certain embodiments, the ODF 90 may be determined for a plurality of fibers within a single voxel including fibers that cross one another within that single voxel.

A variety of techniques may be utilized to determine or compute the ODF 90. For example, Q-ball imaging (QBI), q-space imaging or diffusion spectrum imaging (DSI), or other techniques may be performed to compute the ODF 90. Approaches utilizing QBI and DSI rely on a Fourier-pair relationship between the diffusion propagator $P(\vec{r}, \Delta)$ and diffusion signal space known as q-space. In QBI, q-space may be densely sampled on a single 3-D spherical shell or multiple 3-D spherical shells. From these samples, the ODF 90 may be determined using a spherical transform (e.g., Funk-Radon transform). In DSI, q-space may be evenly sampled on a 3-D grid, bounded by an imaginary sphere of a maximum q-space value, $q_{max}$.

As mentioned above, the ODF 90 includes lobes 73 representative of a probability of diffusion in a given direction for the one or more fibers. The method 84 includes characterizing the ODF 90 (e.g., the geometry or aspect ratio of the lobes 73) to determine one or more characteristics 92 of the ODF 90 (block 94). For example, the aspect ratio of the lobes 73 may include extrema values such as one or more minimum values and one or more maximum values for the lobes 73 as described above.

Figure 4:
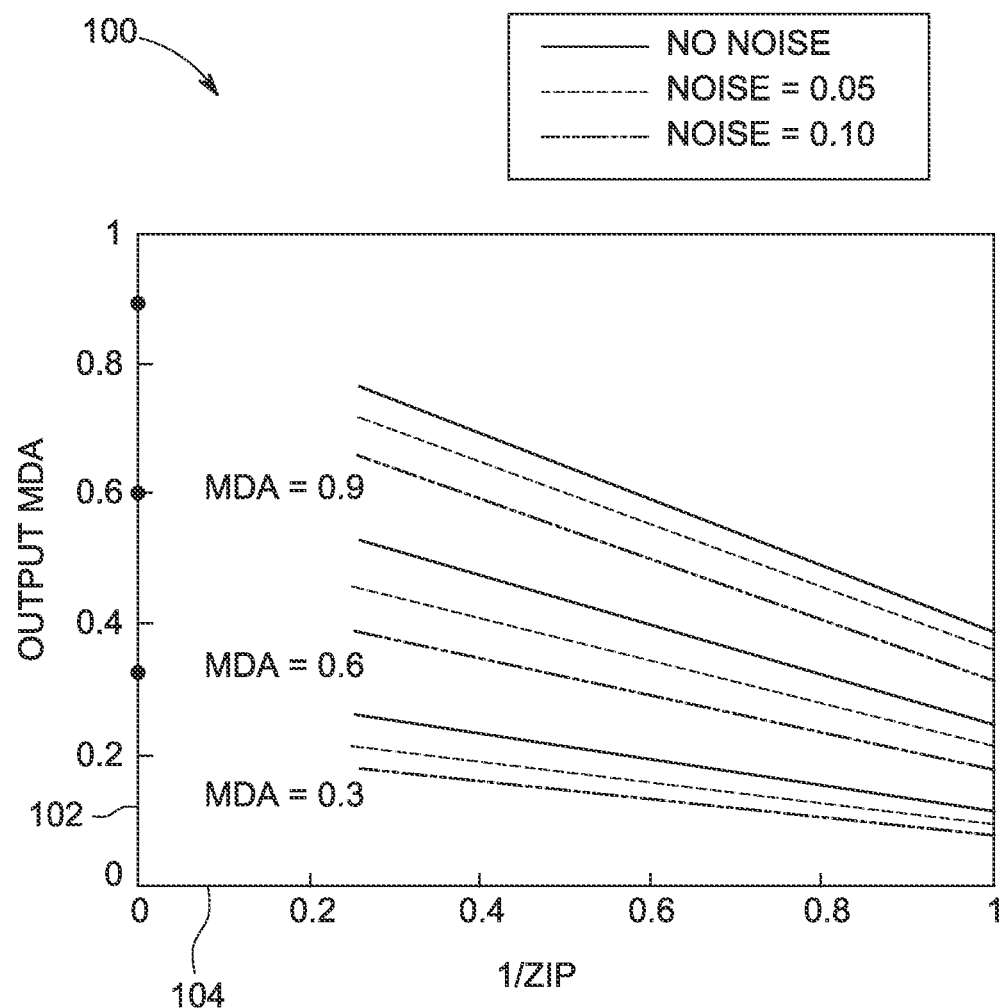
FIG. 4 is an embodiment of a graphical representation of plots of computed multi-directional anisotropy metric from a single-fiber ODF simulation against an inverse of a zero-padding factor.

The method 84 includes determining the MDA 96 for one or more fibers based on one or more ODF characteristics 94 (e.g., aspect ratio of the lobes 73) (block 98). In particular, the MDA metric 96 is directly determined from the ODF 90 without doing a decomposition of the fibers within the given voxel. In certain embodiments (e.g., DSI), in order to determine or compute the MDA metric 96, a digital Fourier transformation from q-space signals into the diffusion propagator, Pr; Δ, must first be performed before obtaining the ODF 90. To obtain an accurate value of the extrema of the ODF 90, a very fine resolution in P® is needed. But this may be impractical to compute digitally. However, in a generic case in which the ODF extrema are first-order critical points (e.g., non-vanishing second derivatives), the leading correction to a very fine resolution of the MDA metric is linear. In other words, the correction is the inverse (1/ZIP) of the oversampling factor of the reconstructed resolution of P® or zero-padding factor in q-space known as ZIP as illustrated in FIG. 4. FIG. 4 illustrates a plot 100 of computed the MDA metric (y-axis 102) as found from a single fiber ODF simulation against the inverse of the ZIP factor (x-axis 104), where the large dots indicate the true values of the MDA metric. The dotted lines, dashed lines, and solid lines represent different noise levels. As illustrated, an increase in noise results in the same linear behavior. Since the MDA metric scales linearly within the inverse of the ZIP factor, the extrapolated anisotropy (MDA metric) at a very fine resolution can be estimated via a linear of the MDA metric versus 1/ZIP factor. The MDA metric may be estimated by utilizing two MDA data points at low resolution, for example, one data point with a zero-padding factor of one and one data point with a padding factor of two in the following equation:

$$MDA_{Predicted} = 2MDA_{ZIP2} - MDA_{No\ Zip}, \quad (7)$$

where $MDA_{ZIP2}$ represents a MDA data point with a zero-padding factor of two and $MDA_{No\ Zip}$ represents a MDA data point with a zero-padding factor of one. Thus, using two MDA data points at different zero-padded resolutions a true MDA may be determined utilizing the linear relationship between the MDA metric at a given resolution and the inverse of the zero-padding factor.

Figure 5:
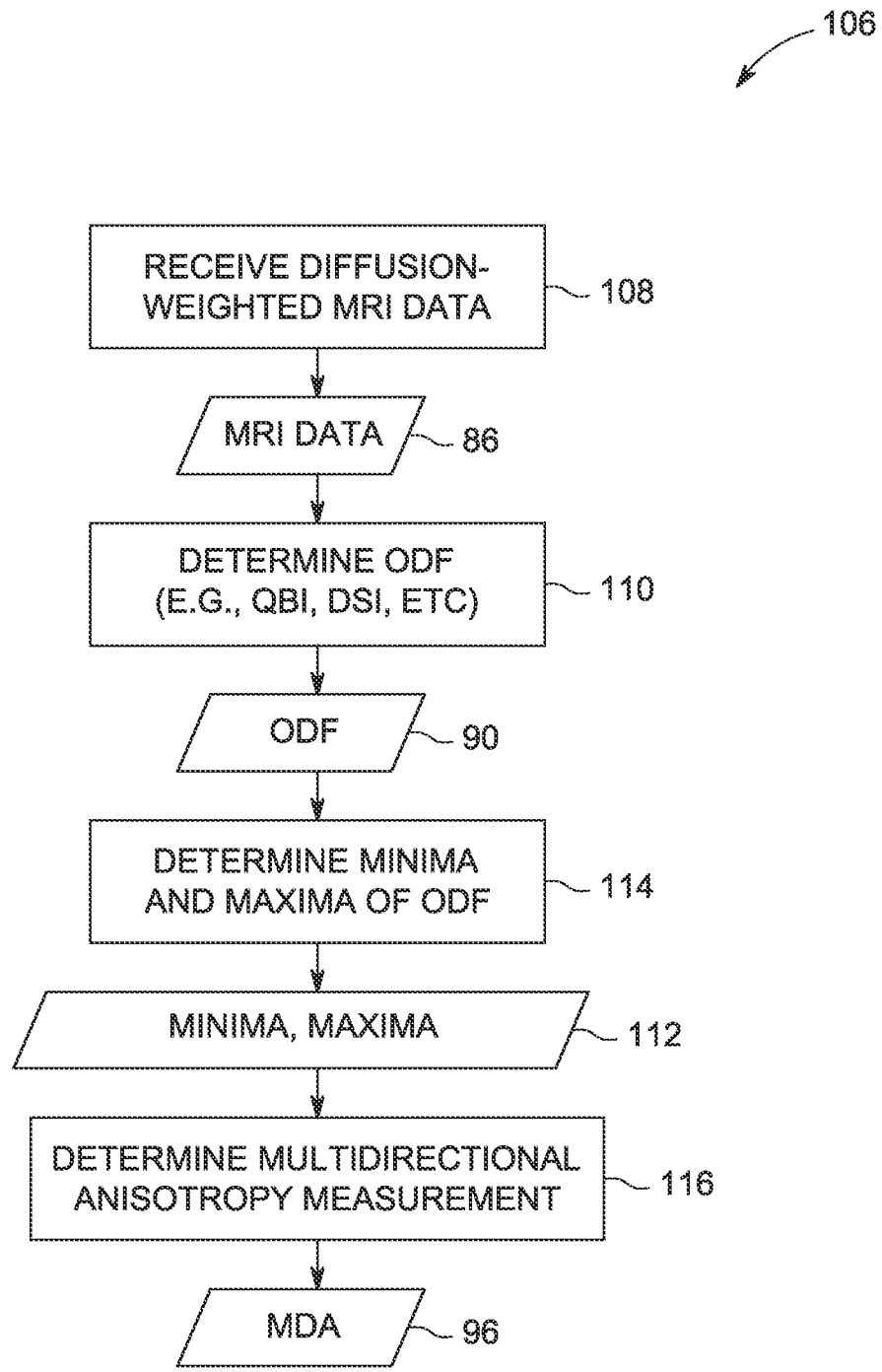
FIG. 5 is an embodiment of a method for measuring diffusional anisotropy in diffusion-weighted magnetic resonance imaging using extrema values of an ODF for fibers within in a voxel.

FIG. 5 illustrates an embodiment of a method 106 for measuring diffusional anisotropy in diffusion-weighted MRI using the extrema values of ODF 90. As within method 84, the method 106 includes receiving diffusion weighted MRI data 86 having multiple voxels (block 108) and determining the ODF 90 for one or more fibers within a single voxel for one or more voxels (block 110) as described above. From the ODF 90, the method 106 includes characterizing the aspect ratio of the lobes 73 by determining the minima and maxima 112 of the ODF 90 (block 114). From one or more each of the minima and maxima 112, the MDA 96 may be determined for one or more fibers (block 116) as described above. As noted above, the MDA 96 is directly determined from the ODF 90 without doing a decomposition of the fibers within the given voxel. Also, in certain embodiments, other values of the aspect ratio of the lobes 73 besides the extrema values may be used, for example, in equation 6 above to determine the MDA metric 96. For example, values near the extrema values (e.g., within approximately 25 percent of the extrema values) may be utilized.

The disclosed embodiments may be interfaced to and controlled by a computer readable storage medium having stored thereon a computer program. The computer readable storage medium may include a plurality of components such as one or more of electronic components, hardware components, and/or computer software components. These components may include one or more computer readable storage media that generally store instructions such as software, firmware and/or assembly language for performing one or more portions of one or more implementations or embodiments of an algorithm as discussed herein. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or solid-state or electronic memory. Other forms of non-transitory and/or tangible computer readable storage media not list may be employed with the disclosed embodiments.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Technical effects of the disclosed embodiments include methods for measuring diffusional anisotropy in diffusion-weighted MRI. In particular, the disclosed embodiments utilize a metric, the MDA metric 96, to measure diffusional anisotropy for multiple fibers with multiple directionalities that cross within a given voxel. The MDA metric 96 is determined directly from the ODF 90 of the fibers within the voxel. The MDA metric 96 provides an accurate metric for diffusional anisotropy that may be utilized as an important biomarker for diseases such as multiple sclerosis as well as for traumatic brain injuries.

This written description uses examples, including the best mode, to enable any person skilled in the art to practice the disclosed embodiments, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of measuring diffusional anisotropy in diffusion-weighted magnetic resonance imaging comprising:
   determining with at least one processor, an orientation diffusion function (ODF) of one or more fibers within a single voxel regardless of whether the fibers cross one another, wherein the ODF is defined by the integral magnitude of a probability of diffusion in a given direction with respect to the one or more fibers (Eqn 3), and the ODF mathematically appears as lobes having maxima peaks and minima troughs which are extrema values of maxima and minima of ODF magnitude, respectively, with respect to the one or more fibers;
   characterizing an aspect ratio of the determined ODF lobes by using the minima troughs ($\Psi$min) over the maxima peaks ($\Psi$max), wherein the $\Psi$min represents a low probability of diffusion in a particular direction and the $\Psi$max represents a high probability of diffusion in another particular direction;
   determining with the at least one processor, a multi-directional anisotropy (MDA) metric, with respect to each of the one or more fibers, within the single voxel, based on the aspect ratio ($\Psi$min/$\Psi$max)$^{2/3}$ of the ODF without doing a decomposition of the one or more fibers, wherein the MDA metric reflects a ratio ($\mu$) between the minima troughs and the maxima peaks of the determined ODF; and
   providing a storable or displayable metric output of the MDA, as an input, when performing diffusion weighted MRI on a magnetic resonance imaging scanner.

2. The method of claim 1, wherein determining the ODF further comprises performing q-ball imaging in order to determine the ODF magnitude.

3. The method of claim 1, wherein determining the ODF further comprises performing diffusion spectrum imaging in order to determine the ODF magnitude.

4. The method of claim 3, wherein determining the multi-directional anisotropy (MDA) metric comprises estimating the multi-directional anisotropy (MDA) metric at a linear resolution that uses at least two multi-directional anisotropy metric data points at different zero-padded resolutions from a linear fit of the multi-directional anisotropy metric and an inverse of a zero-padding factor.

5. The method of claim 4, wherein estimating the multi-directional anisotropy metric ($MDA_{Predicted}$) comprises the following equation: $MDA_{Predicted} = 2MDA_{ZIP2} - MDA_{No\ ZIP}$, wherein the $MDA_{ZIP2}$ represents a first multi-directional anisotropy metric data point with a zero-padding factor of two and $MDA_{No\ zip}$ represents a second multi-directional anisotropy metric data point with a zero-padding factor of one.

6. The method of claim 1, wherein the multidirectional anisotropy metric comprises $$MDA = \frac{1-\mu}{\sqrt{1+2\mu^2}},$$

wherein $$\mu = \left(\frac{\Psi_{min}}{\Psi_{max}}\right)^{2/3},$$

$\psi_{min}$ represents a minimum value of the ODF, and $\psi$max represents a maximum value of the ODF.

7. The method of claim 1, comprising determining the ODF of a plurality of fibers within the single voxel, at least some of the plurality of fibers cross one another within the single voxel, and determining the multi-directional anisotropy metric of the plurality of fibers is based on the aspect ratio of the determined ODF lobes.

8. A non-transitory, computer-readable medium comprising:
one or more routines, which when executed by at least one processor, causes acts of determining diffusional anisotropy that is used diffusion-weighted magnetic resonance imaging is performed comprising:
determining with at least one processor, an orientation diffusion function (ODF) of one or more fibers within a single voxel regardless of whether the fibers cross one another, wherein the ODF is defined by the integral magnitude of a probability of diffusion in a given direction with respect to the one or more fibers (Eqn 3) and the ODF mathematically appears as lobes having maxima peaks and minima troughs which are extrema values of maxima and minima of ODF magnitude, respectively, with respect to the one or more fibers;
characterizing an aspect ratio of the determined ODF lobes by using the minima troughs (Ψmin) over the maxima peaks (Ψmax), wherein the Ψmin represents a low probability of diffusion in a particular direction and the Ψmax represents a high probability of diffusion in another particular direction;
determining with the at least one processor, a multi-directional anisotropy (MDA) metric with respect to each of the one or more fibers, within the single voxel, based on the aspect ratio (Ψmin/Ψmax)$^{2/3}$ of the ODF without doing a decomposition of the one or more fibers, wherein the MDA metric reflects a ratio (μ) between the minima troughs and the maxima peaks of the determined ODF; and
providing the metric output of the MDA as an input, into a magnetic resonance imaging scanner, when performing diffusion weighted MRI on a magnetic resonance imaging scanner.

9. The non-transitory, computer-readable medium of claim 8, further comprising receiving with the magnetic resonance imaging scanner, diffusion-weighted magnetic resonance imaging data across multiple voxels.

10. The non-transitory, computer-readable medium of claim 8, wherein determining the ODF further comprises performing q-ball imaging in order to determine the ODF magnitude.

11. The non-transitory, computer-readable medium of claim 8, wherein determining the ODF further comprises performing diffusion spectrum imaging in order to determine the ODF magnitude.

12. The non-transitory, computer-readable medium of claim 1, wherein determining the multi-directional anisotropy metric comprises estimating the multi-directional anisotropy (MDA) metric at a resolution that uses at least two multi-directional anisotropy metric data points at different zero-padded resolutions from a linear fit of the multi-directional anisotropy metric and an inverse of a zero-padding factor.

13. The non-transitory, computer-readable medium of claim 12, wherein estimating the multi-directional anisotropy metric ($MDA_{Predicted}$) comprises the following equation: $MDA_{Predicted} = 2MDA_{ZIP2} - MDA_{No\ ZIP}$, wherein the $MDA_{ZIP2}$ represents a first multi-directional anisotropy metric data point with a zero-padding factor of two and $MDA_{No\ Zip}$ represents a second multi-directional anisotropy metric data point with a zero-padding factor of one.

14. The non-transitory, computer-readable medium of claim 8, wherein the multidirectional anisotropy metric comprises $$MDA = \frac{1-\mu}{\sqrt{1+2\mu^2}},$$

wherein $$\mu = \left(\frac{\Psi_{min}}{\Psi_{max}}\right)^{2/3},$$

$\psi_{min}$ represents a minimum value of the ODF, and $\psi_{max}$ represents a maximum value of the ODF.

15. The non-transitory, computer-readable medium of claim 8, comprising determining the ODF of a plurality of fibers within the single voxel, where at least some of the plurality of fibers cross one another within the single voxel, and determining the multi-directional anisotropy metric of the plurality of fibers is based on the aspect ratio of the determined ODF lobes.

\* \* \* \* \*